| United States Patent [19] | [11] 3,945,807 |
|---|---|
| Fukutome | [45] Mar. 23, 1976 |

[54] METAL TOOL

[75] Inventor: Riichi Fukutome, Kanagawa, Japan

[73] Assignee: Nihon Shinku Gijutsu Kabushiki Kaisha, Chigasasaki, Japan

[22] Filed: Nov. 15, 1973

[21] Appl. No.: 416,281

[30] Foreign Application Priority Data
Nov. 16, 1972 Japan............................ 47-114313

[52] U.S. Cl. ............. 29/182.3; 29/182.7; 29/187.8; 75/203; 75/204; 75/208 R; 408/199; 408/704; 408/226; 408/230; 76/108 R
[51] Int. Cl.$^2$........................ B22F 3/00; B21K 5/02
[58] Field of Search..................... 75/203, 208, 204; 29/182.3, 182.7, 182.8; 76/108 R; 408/199, 704, 226, 230

[56] References Cited
UNITED STATES PATENTS

| 1,342,801 | 6/1920 | Gebauer............................ 75/208 R |
|---|---|---|
| 2,363,337 | 11/1944 | Kelly................................. 148/3 |
| 2,648,747 | 8/1953 | Graves............................. 75/208 R |
| 2,826,512 | 3/1968 | Rex................................... 117/70 |
| 2,899,338 | 8/1959 | Goetzel et al.................... 75/208 R |
| 2,978,353 | 4/1961 | Meier................................ 117/37 |
| 3,366,463 | 1/1968 | Schreiner........................ 75/208 R |
| 3,506,500 | 4/1970 | Talmage............................ 75/208 |

Primary Examiner—Leland A. Sebastian
Assistant Examiner—B. H. Hunt
Attorney, Agent, or Firm—Haseltine, Lake & Waters

[57] ABSTRACT

A tool such as a drill, etc. made of a hard metal, e.g., a cemented carbide, having applied thereto a coating film of a noble metal such as gold, silver, platinum, etc. by means of an ion-plating treatment.

7 Claims, No Drawings

METAL TOOL

BACKGROUND OF THE INVENTION

This invention relates to a tool such as a drill used, for example, in drilling a base plate for wire printing.

Heretofore, the drills previously used for this kind of work have been made of a hard metal such as, e.g., a cemented carbide of the Wc-Co series, WC-TiC-Co series or the like, but drills of this kind have been defective in that, during their repeated use, there has been a comparatively rapid increase in the rifling and smearing appearing on the inner surface of the hole being drilled, thereby causing degradation of the products and necessitating that the drill be replaced by a new one at an early stage.

A significant advantage afforded by the present invention resides in its provision of a tool such as a drill or the like that is free from the foregoing defects.

SUMMARY OF THE INVENTION

In accordance with the present invention, there is provided a metal tool such as a drill or the like that is made of a hard metal such as a cemented carbide, to which a film coating of a noble metal such as gold, silver, platinum, etc. is applied by means of an ion-plating treatment.

DESCRIPTION OF THE PREFERRED EMBODIMENTS

In a preferred embodiment of this invention, the noble metal that is applied to the hard metal tool as a film coating is applied in a manner that is not especially different from the conventional ion-plating treatment that is known in the art. The present method of ion-plating comprises introducing a hard metal drill and a noble metal vapor source into a vacuum treatment chamber and applying, to the drill side, a negative electric potential so as to form an ionized space between the drill and the vapor source, such that the vapor generated from the vapor source is ionized within that space and is attracted to the negative electric potential of the drill side and driven into the surface of the drill, thereby forming a coating film of noble metal thereon, whereby the coating film thus obtained is remarkably uniform and has excellent adhesion in comparison with that obtained by conventional treatment such as by chemical plating or the like. The thickness of the coating film is in general from several microns to several tens of microns.

The present invention is further illustrated by the following example wherein hard metal drills were film coated with various noble metals by the present method of ion-plating as described above and the resultant coated drills compared against a blank, i.e., an uncoated drill, with respect to the nature and character of the rifling and smearing results obtained from drilling resinous base plates used for wire printing with each of such drills.

EXAMPLE

A gold film coated drill A1, a silver film coated drill A2, a platinum film coated drill A3 and a conventional drill A0, having no film coating, were subjected to the following comparison test to obtain the results shown in the table set forth below. The comparison test consisted of repeated drilling, many times, of five resin plates, each having thereon printed wires and being stacked one upon another, from the above surface of said plates with each of the drills A0, A1, A2, and A3, and the resultant holes obtained were observed by a magnifying lens and evaluated. The evaluation was on the basis of a marking or grading system of 5 points, whereby a given, tested drill which was considered to have passed the test and have performed satisfactorily was given 3 points or more, and, if its performance was considered better than satisfactory i.e., desirable, it was given 4 points or more.

Each drill used in the test was made of a metal of WC-Co and was 1 mm in diameter; the drilling was effected by revolving the drill at a speed of 4000 r.p.m. and a feeding speed of 2000 mm/min. or 2800 mm/min.; and the inner surface of the hole of the uppermost position plate or the lowermost position plate was observed in respect of the rifling and smearing obtained at each end with the following number of times of drilling: 500, 1000, 1500, 2000 and 2500. The results obtained are shown in the following table.

| Drill | A0 | A0 | A0 | A0 | A1 | A1 | A1 | A1 | A2 | A2 | A3 | A3 |
| --- | --- | --- | --- | --- | --- | --- | --- | --- | --- | --- | --- | --- |
| Feeding speed | 2000 | 2800 | 2000 | 2800 | 2000 | 2800 | 2000 | 2800 | 2800 | 2800 | 2800 | 2800 |
| Position of plate | UPper | Upper | Lower | Lower | Upper | Upper | Lower | Lower | Upper | Lower | Upper | Lower |
| Rifling | | | | | | | | | | | | |
| 500 | 4 | 4 | 4 | 3 | 5 | 5 | 5 | 5 | 5 | 5 | 5 | 5 |
| 1000 | 4 | 4 | 4 | 3 | 5 | 5 | 4 | 4 | 4 | 4 | 5 | 5 |
| 1500 | 4 | 3 | 3 | 3 | 5 | 5 | 4 | 4 | 4 | 4 | 5 | 5 |
| 2000 | 3 | 3 | 3 | 2 | 5 | 5 | 4 | 4 | 4 | 4 | 5 | 4 |
| 2500 | 3 | 3 | 3 | 2 | 5 | 5 | 4 | 4 | 4 | 4 | 5 | 4 |
| Smearing | | | | | | | | | | | | |
| 500 | 4 | 4 | 5 | 3 | 5 | 5 | 5 | 5 | 5 | 5 | 5 | 5 |
| 1000 | 4 | 4 | 5 | 3 | 5 | 5 | 5 | 5 | 5 | 5 | 5 | 5 |
| 1500 | 3 | 4 | 4 | 2 | 5 | 5 | 5 | 5 | 5 | 5 | 5 | 5 |
| 2000 | 3 | 4 | 4 | 2 | 5 | 5 | 5 | 5 | 4 | 4 | 5 | 5 |
| 2500 | 3 | 4 | 4 | 2 | 5 | 5 | 5 | 5 | 4 | 4 | 5 | 5 |
| Total points | 35 | 37 | 39 | 28 | 50 | 50 | 46 | 46 | 44 | 44 | 50 | 48 |

As is clear from the above table of results, the conventional hard metal drill A0 having no film coating thereon scored from 3 points to 4 points with regard to rifling from the initial period of use and later became disqualified with a grade of 2 points at the lowermost plate, especially when its use reached 2000 times. Additionally, it scored from 3 points to 4 points with regard to smearing, from its initial period of use and later became disqualified with a score of 2 points at the lowermost plate, especially when its use reached 1500 times. However, the products of the present invention A1, A2, and A3 all kept scores of 4 points to 5 points throughout the test. Although the reasons for the success of the present products are not clearly understood, it is nevertheless believed that such factors, as the following, acting collectively, might account for it: (1) the noble metal coating film serves as a lubricant; (2) the escape of heat is rapid because the noble metal coating film has a good heat conductivity; and (3) the noble metal coating film has such good adhesion to the metal drill that it does not peel off during use because it was formed by means of the ion-plating treatment described above.

Thus, according to this invention, the simple application of a noble coating film on the surface of a hard metal tool such as a drill by means of ion-plating, makes it possible to always obtain excellent worked holes, even with repeated use of numerous times per use, thereby markedly improving the working of such tool and rendering its use more economical.

What is claimed is:

1. A metal tool adapted for drilling holes in resin plates for wire printing, said tool comprising a cemented metal carbide base, and a iron-plated coating film on said base, said coating film being a noble metal selected from the group consisting of gold, silver and platinum, said coating film constituting a means for producing smooth drilled holes in the resin plates with prolonged usage.

2. A tool as claimed in claim 1 wherein said coating film has a thickness of between several microns and several tens of microns.

3. A tool as claimed in claim 1 wherein the cemented metal carbide is selected from the group consisting of WC-Co, WC-TiC-Co, and alloys thereof.

4. A method comprising drilling holes in resin plates for wire printing with a tool formed by ion-plating a coating film on a metal carbide base, said coating film being a noble metal selected from the group consisting of gold, silver, and platinum, said film enabling the production of smooth drilled holes in the resin plates with prolonged usage.

5. A method as claimed in claim 4 wherein said base is a cemented metal carbide base.

6. A method as claimed in claim 5 wherein the cemented metal carbide base is selected from the group consisting of WC-Co, WC-TiC-Co, and alloys thereof.

7. A method as claimed in claim 4 wherein said coating film is formed with a thickness of between several microns and several tens of microns.

* * * * *